US008169066B2

(12) United States Patent
Han et al.

(10) Patent No.: US 8,169,066 B2
(45) Date of Patent: May 1, 2012

(54) SEMICONDUCTOR PACKAGE

(75) Inventors: Chang-Hoon Han, Cheonan-si (KR); Jinho Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 123 days.

(21) Appl. No.: 12/659,391

(22) Filed: Mar. 8, 2010

(65) Prior Publication Data
US 2010/0237484 A1 Sep. 23, 2010

(30) Foreign Application Priority Data
Mar. 19, 2009 (KR) .................. 10-2009-0023628

(51) Int. Cl.
*H01L 23/02* (2006.01)
(52) U.S. Cl. .............. 257/686; 257/685; 257/E23.079; 257/E25.03
(58) Field of Classification Search ............ 257/686, 257/685, E23.079, E25.03
See application file for complete search history.

(56) References Cited

U.S. PATENT DOCUMENTS

| 6,043,558 | A * | 3/2000 | Manning ................ 257/691 |
| 7,048,197 | B2 * | 5/2006 | Nishizawa et al. ........ 235/492 |
| 7,235,870 | B2 * | 6/2007 | Punzalan, Jr. et al. ...... 257/685 |
| 7,902,679 | B2 * | 3/2011 | Lin et al. ................ 257/778 |
| 2008/0073771 | A1 | 3/2008 | Seo et al. |

FOREIGN PATENT DOCUMENTS

| JP | 2004-172157 | 6/2004 |
| KR | 10-0770934 | 10/2007 |
| KR | 10-0842915 | 6/2008 |

* cited by examiner

*Primary Examiner* — Jasmine Clark
(74) *Attorney, Agent, or Firm* — Harness, Dickey & Pierce, P.L.C.

(57) ABSTRACT

Provided is a semiconductor package including a first package and a second package. The first package includes a first substrate having a first front side and a first back side opposing the first front side. The first package further includes a first semiconductor chip on the first front side and an external connection member on the first semiconductor chip. The external connection member may be configured to electrically connect the first semiconductor chip to an external device. The second package includes a second substrate having a second back side facing the first back side of the first substrate and a second front surface opposing the second back side. The second package includes a second semiconductor chip on the second front side. The semiconductor package further includes an internal connection member between the first back side and the second back side to electrically connect the first package to the second package.

16 Claims, 17 Drawing Sheets

SEMICONDUCTOR PACKAGE

CROSS-REFERENCE TO RELATED APPLICATIONS

This U.S. non-provisional patent application claims priority under 35 U.S.C. §119 to Korean Patent Application No. 10-2009-0023628, filed on Mar. 19, 2009, in the Korean Intellectual Property Office (KIPO), the entire contents of which are hereby incorporated by reference.

BACKGROUND

1. Field

The present disclosure herein relates to a semiconductor package, and more particularly, to a package-on-package (POP) type semiconductor package.

2. Description of the Related Art

In the semiconductor industry, various semiconductor devices and electronics using the semiconductor devices are increasingly required to have high capacity, compactness, and small size. Accordingly, various packaging technologies with respect to the characteristics described above are being developed. One of the packaging technologies is known as a technology in which a plurality of semiconductor chips may be vertically stacked to realize a high density chip stacking. According this technology, a plurality of semiconductor chips having various functions may be stacked in a relatively small area when compared to a general package including one semiconductor chip. However, packaging technologies in which a plurality of semiconductor chips is stacked may have a relatively low yield compared to single chip packaging technologies.

SUMMARY OF THE INVENTIVE CONCEPTS

Example embodiments of the inventive concepts provide a package-on-package type semiconductor package having a lower height and improved reliability. Example embodiments of the inventive concepts also provide a package-on-package type semiconductor package including first and second semiconductor packages having high capacity.

In accordance with an example embodiment of the inventive concepts, a semiconductor package may include a first package, a second, package, and an internal connection member. The first package may include a first substrate having a first front side and a first back side opposing the first front side. The first package may further include a first semiconductor chip on the first front side and an external connection member on the first semiconductor chip. The external connection member may be configured to electrically connect the first semiconductor chip to an external device. The second package may include a second substrate having a second front side and a second backside. In accordance with this example embodiment of the inventive concepts, the second back side may face the first back side of the first substrate and the second front side may oppose the second back side. The second package may further include a second semiconductor chip on the second front side. The internal connection member may be between the first back side and the second back side and may electrically connect the first package to the second package.

Another example embodiment of the inventive concepts provide semiconductor packages including a first package and a second package. The first package may include a first substrate having a first front side on which a first semiconductor chip is mounted and a first back side opposing the first front side. The first package may also include an external connection member disposed on the first semiconductor chip to electrically connect the first semiconductor chip to an external device. The second package may include a second substrate having a second back side opposing the first back side of the first substrate and a second front surface facing the second back side. A second semiconductor chip may be mounted on the second front side. In accordance with example embodiments of the inventive concepts, an internal connection member may be disposed between the first back side and the second back side to electrically connect the first package to the second package.

In some example embodiments of the inventive concepts, the first substrate may have a thermal expansion coefficient equal or similar to that of the second substrate. The first substrate may have an area less or greater than that of the second substrate.

In other example embodiments of the inventive concepts, the internal connection member may include a first connection pad electrically connected to the first semiconductor chip on the first back side of the first substrate, a second connection pad electrically connected to the second semiconductor chip on the second back side of the second substrate, and an internal connection terminal disposed between the first connection pad and the second connection pad to electrically connect the first connection pad to the second connection pad. The internal connection terminal may have a pad shape.

In still other example embodiments of the inventive concepts, the external connection member may include a first rewiring pad electrically connected to the first substrate, and a second rewiring pad electrically connected to the first rewiring pad.

In even other example embodiments of the inventive concepts, the first package may further include a first molding layer molding the first semiconductor chip and covering the first rewiring pad, the first molding layer having a hole exposing the second rewiring pad, and the second package may further include a second molding layer molding the second semiconductor chip. The external connection member may further include an external connection terminal inserted into the hole to contact the second rewiring pad, the external connection terminal being exposed to the outside.

In yet other example embodiments of the inventive concepts, the first package may further include a first conductive member electrically connecting the first rewiring pad to the first substrate, and the second package may further include a second conductive member electrically connecting the second semiconductor chip to the first substrate.

In further example embodiments of the inventive concepts, the first and second conductive members may include a bonding wire or a through electrode.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the figures.

DETAILED DESCRIPTION OF THE EXAMPLE EMBODIMENTS

Figure 1A:
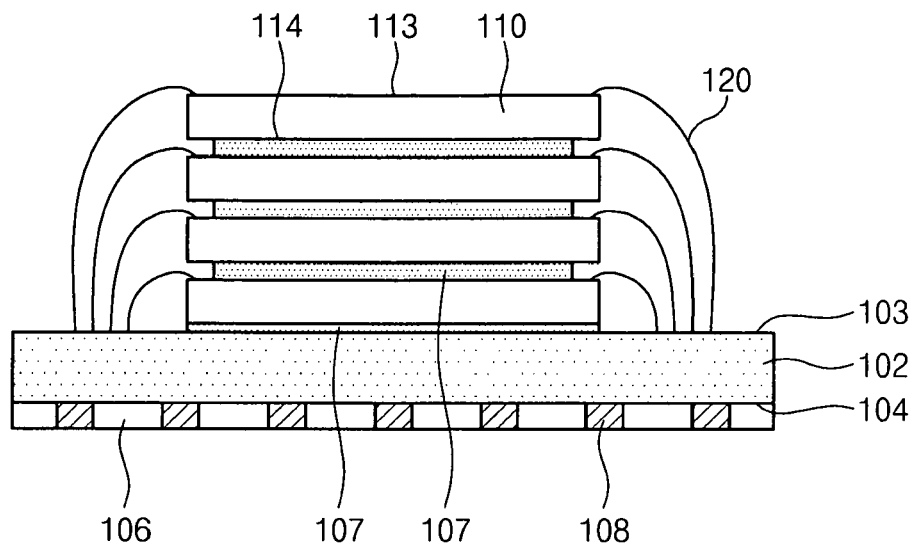
FIGS. 1A through 1E are sectional views illustrating a process of fabricating a semiconductor package according to a first example embodiment of the inventive concepts.

Example embodiments of the inventive concepts will now be described more fully with reference to the accompanying drawings, in which example embodiments are shown. The invention may, however, be embodied in different forms and should not be construed as limited to the example embodiments set forth herein. Rather, these example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Example embodiments of the inventive concepts will be described below in more detail with reference to the accompanying drawings. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art. Like reference numerals refer to like elements throughout.

Figure 6A:
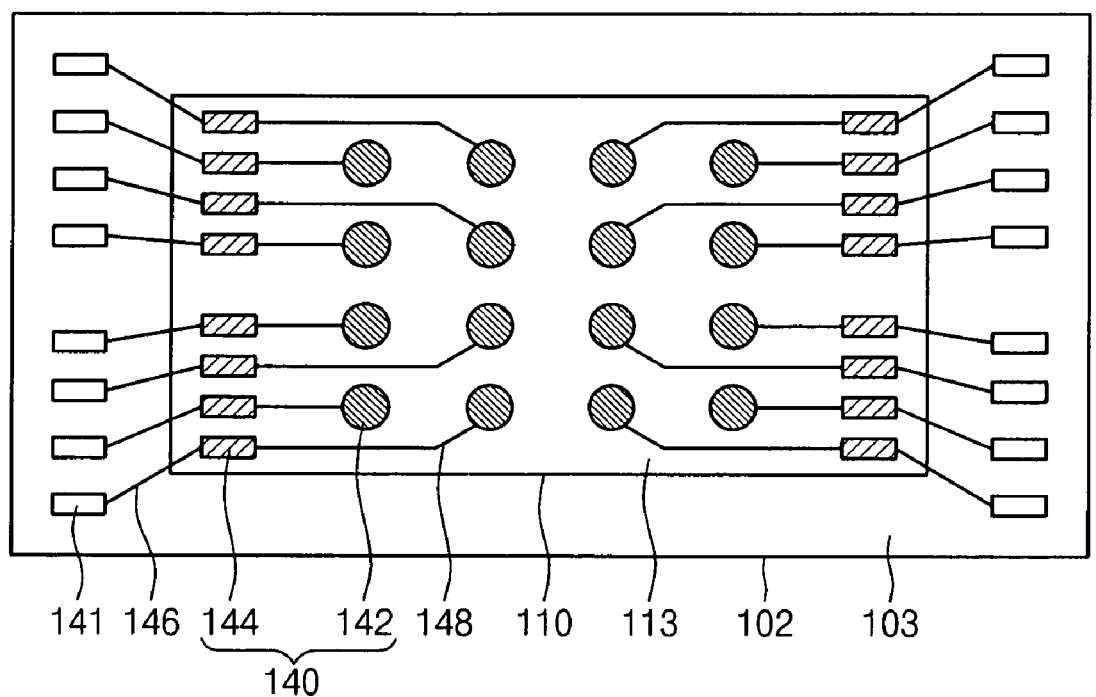
FIGS. 6A through 6C are enlarged plan views illustrating a portion of FIG. 1B.
Figure 6B:
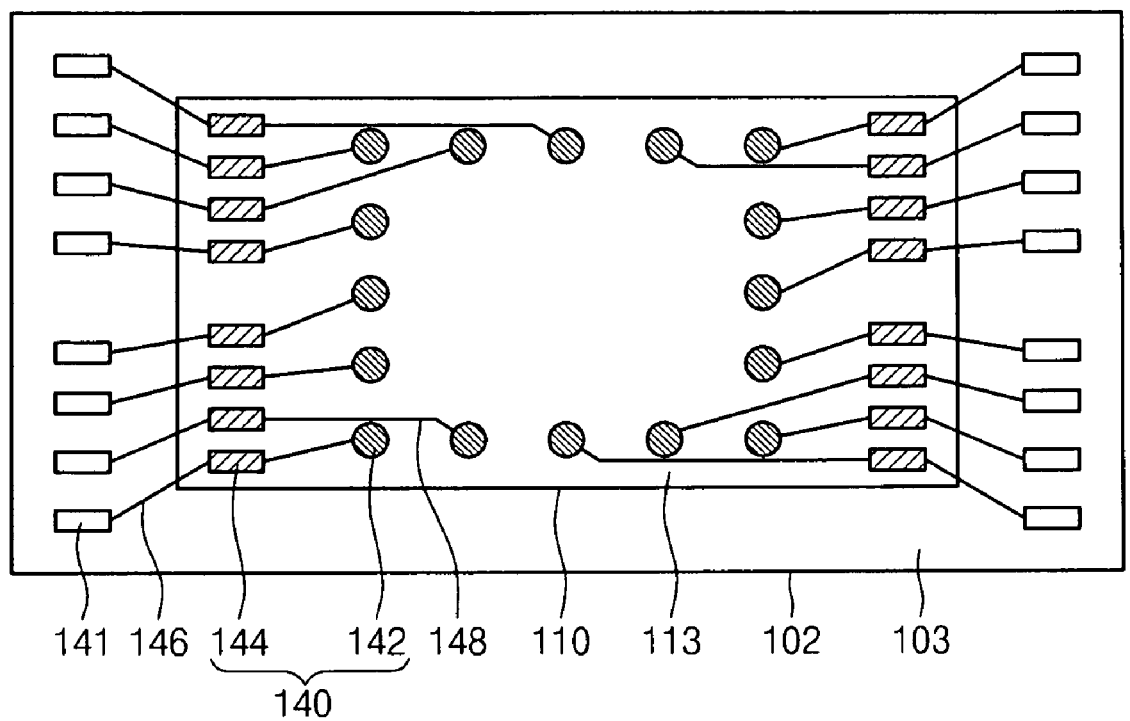
Figure 6C:
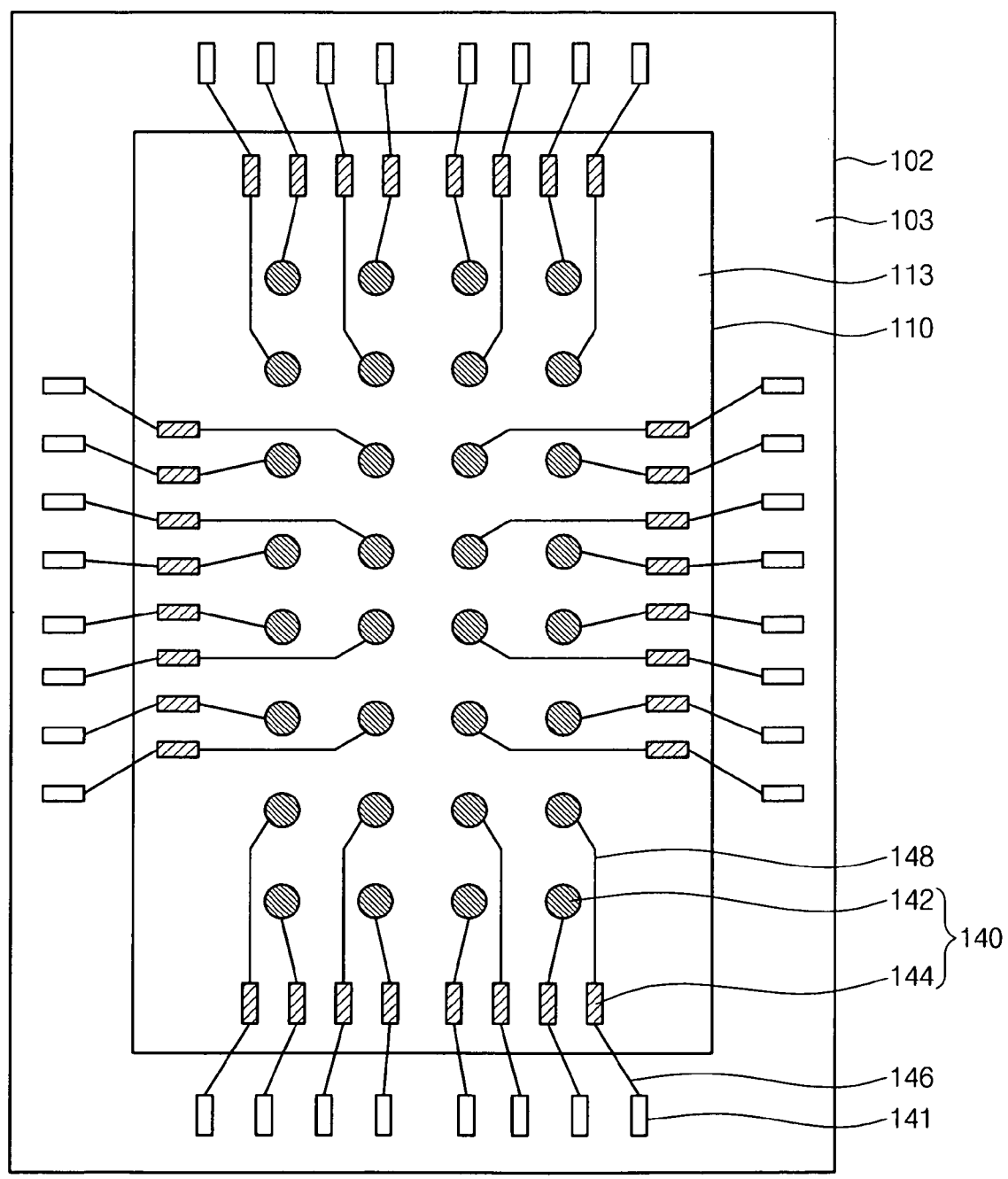

FIGS. 1A through 1E are sectional views illustrating a process of fabricating a semiconductor package according to a first example embodiment of the inventive concepts. FIGS. 6A through 6C are enlarged plan views illustrating a portion of FIG. 1B.

Referring to FIG. 1A, a first substrate 102 having a front side 103 and a back side 104 is prepared. For example, the first substrate 102 may include a printed circuit board (PCB).

A plurality of first semiconductor chips 110 may be mounted on the front side 103 of the first substrate 102. The plurality of first semiconductor chips 110 may include a memory chip or a logic chip. For example, when the first semiconductor chips 110 are stacked on each other to form a plurality of first semiconductor chips 110, at least one of the first semiconductor chips 110 of the plurality of first semiconductor chips 110 may be the memory chip, and another first semiconductor chip 110 of the plurality of first semiconductor chips 110 may be the logic chip. The first semiconductor chips 110 may be stacked so that non-active surfaces 114 of the first semiconductor chips 110 face the front side 103 of the first substrate 102, and active surfaces 113 of the first semiconductor chips 110 face away from the front side 103. Adhesive layers 107 may be disposed between the first substrate 102 and the plurality of first semiconductor chips 110 as well as between the each of the first semiconductor chips 110 of the plurality of first semiconductor chips 110, respectively. The plurality of first semiconductor chips 110 may be electrically connected to the first substrate 102 by electrical connection members, e.g., a plurality of first bonding wires 120. Ends of the first bonding wires 120 may contact pads (not shown) disposed on the active surfaces 113 and the front side 103.

A first dielectric 106 including first connection pads 108 may be formed on the back side 104 of the first substrate 102. The first connection pads 108 are electrically connected to the pads disposed on the front side 103 of the first substrate 102 through a conductive interconnection (not shown) that transmits electrical signals to the inside of the first substrate 102. That is, the first connection pads 108 may be electrically connected to the first semiconductor chips 110 through the first bonding wires 120 and the pads disposed on the front side 103 of the first substrate 102. The first connection pads 108 may be exposed by the first dielectric 106.

Figure 1B:
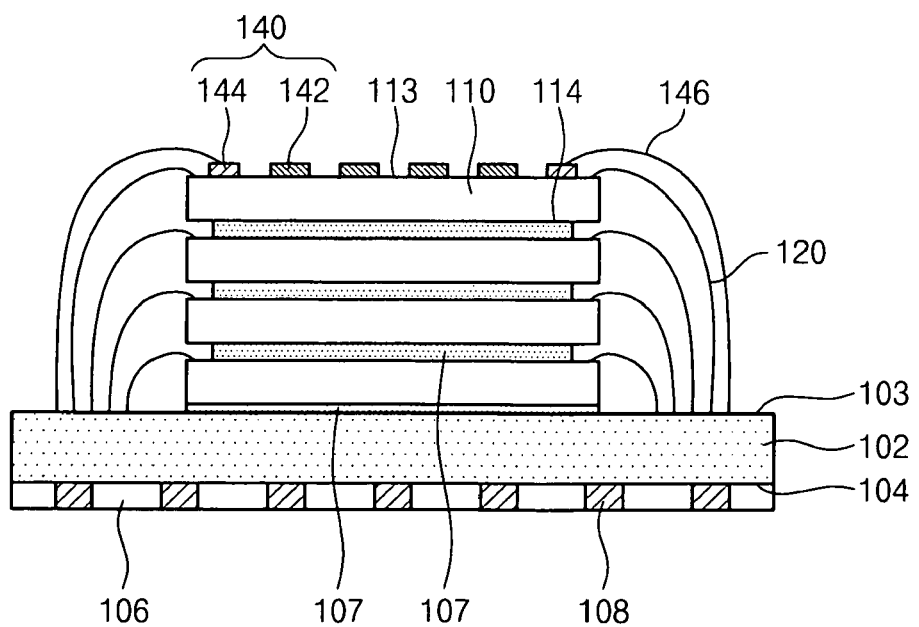

Referring to FIG. 1B, a rewiring structure 140 is disposed on the active surface 113 of the uppermost first semiconductor chip 110. An electrical connection member 146 is formed to electrically connect the rewiring structure 140 to the first substrate 102. The rewiring structure 140 may be formed of a metal, for example, copper, gold, silver, platinum, or an alloy thereof. The electrical connection member 146 may be, for example, a bonding wire that may be formed to electrically connect the rewiring structure 140 to the first substrate 102. The first semiconductor chip 110 having the rewiring structure 140 may be stacked as the uppermost first semiconductor chip 110. The rewiring structure 140 will be described in detail with reference to FIGS. 6A through 6C illustrating a plan view of FIG. 1B.

Referring to FIGS. 1B and 6A, the rewiring structure 140 may include a first rewiring pad 144 and a second rewiring pad 142. The first rewiring pad 144 may be disposed adjacent to an edge of the active surface 113 of the first semiconductor chip 110. The second rewiring pad 142 may be disposed in a central region of the active surface 113. The second rewiring pad 142 and the first rewiring pad 144 may be electrically connected to each other by a conductive line 148. A pad 141 contacting the bonding wire 146 may be disposed on an edge of the front side 103 of the first substrate 102.

As shown in FIG. 6A, the second rewiring pad 142, the first rewiring pad 144, and/or the conductive line 148 may be provided in plurality. Additionally, the bonding wire 146 and/or the pads 141 may likewise be provided in plurality. For example, the first rewiring pad 144 may be provided in plurality and may be disposed near edges of the active surface 113 which are on opposite sides of the active surface 113 and the second rewiring pad 142 may be provided in plurality in a central region of the active surface 113. As shown in FIG. 6A, the plurality of first rewiring pads 144 and the plurality of second rewiring pads 142 may be connected by a plurality of conductive lines 148. Furthermore, the plurality of first rewiring pads 144 may be connected to a plurality of pads 141 on the front side 103 of the first substrate 102 by a plurality of bonding wires 146.

FIG. 6B illustrates a modified example of FIG. 6A. The rewiring structure 140 may include a first rewiring pad 144 and a second rewiring pad 142. The first rewiring pad 144 may be disposed adjacent to edges of oppositely facing sides of the active surface 113 of the first semiconductor chip 110. The second rewiring pad 142 may be disposed adjacent to the first rewiring pad 144 and the other edges of the active surface 113. Other components may be equal to those described with reference to FIG. 6A.

FIG. 6C illustrates another modified example of FIG. 6A. A first rewiring pad 144 may be disposed adjacent to edges of the active surface 113 of the first semiconductor chip 110. A pad 141 electrically connected to the first rewiring pad 144 through the bonding wire 146 may be disposed on the front side 103 of the first substrate 102. Other components may be equal to those described with reference to FIG. 6A.

As shown in FIGS. 6A through 6C, the second rewiring pad 142 according to the first example embodiment of the inventive concepts may be disposed with various shapes corresponding to an external circuit pattern (not shown) to be electrically connected thereto.

Figure 1C:
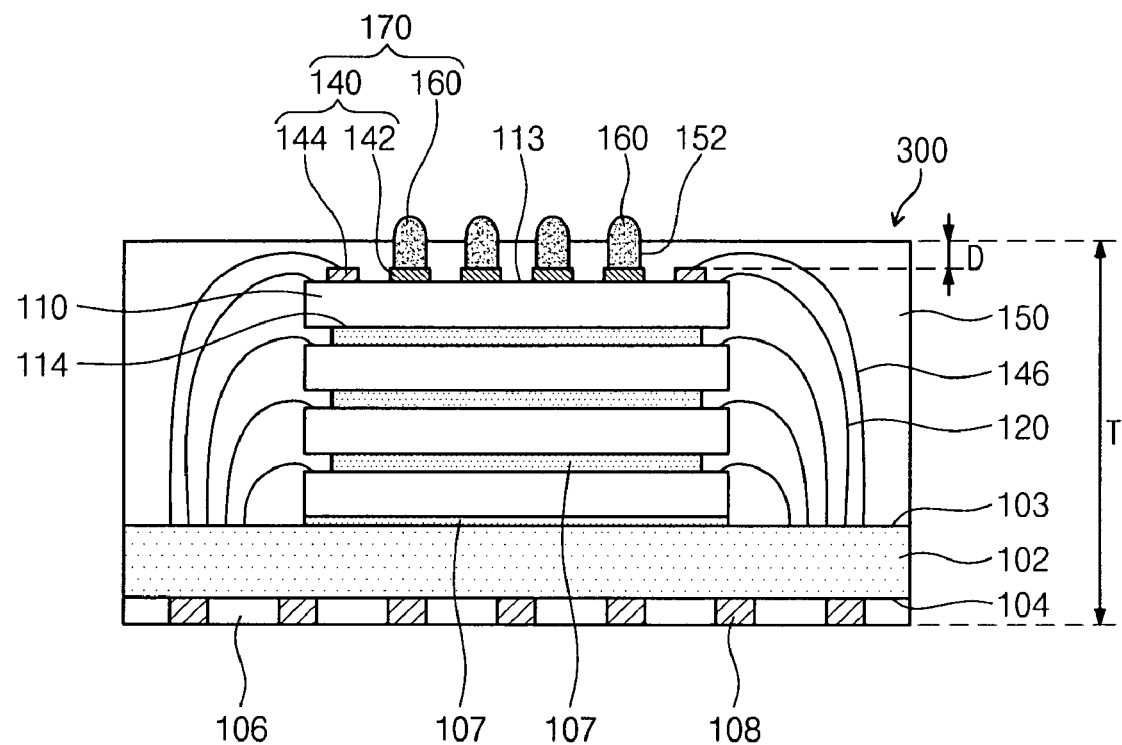

Referring to FIG. 1C, a first molding layer 150 covering the first semiconductor chips 110 may be formed on the front side 103 of the first substrate 102. For example, the first molding layer 150 may be formed of epoxy molding compound (EMC). A portion of the first molding layer 150 is removed to define a hole 152 through which the second rewiring pad 142 is exposed. For example, the hole 152 formation process may include a laser drilling process. The hole 152 may have a first depth D.

An external connection terminal 160 fills the hole 152 to contact the second rewiring pad 142. As shown in FIG. 1C, the external connection terminal 160 is formed so that a portion of the external connection terminal 160 is exposed to the outside. For example, a solder ball may be inserted into the hole 152, and a reflow process may be performed to form intermetallic bonds or intermetallic compounds between at least solder ball and the second rewiring pad 142, thereby realizing a complete electrical coupling. For example, the reflow process may be performed at a temperature of about 200° C. to about 300° C. The external connection terminal 160 may be used as an electrical connection medium for the outside and may serve to connect the first package to an external device. The rewiring structure 140 and the external connection terminal 160 may constitute an external connection member 170. Thus, the plurality of first semiconductor chips 110 may be stacked, and a first semiconductor package 300 including the external connection member 170 may be completed.

According to the first example embodiment of the inventive concepts, the external connection terminal 160 may include a buried portion disposed in the hole 152 and exposed portion outside of the hole 152. A thickness T of the first semiconductor package 300 may be thinner by an amount corresponding to the first depth D of the buried portion than the formation of the solder ball (not shown) exposed to the back side 104 of the first substrate 102. The first semiconductor package 300 may be independently used as a multi-chip package (MCP).

Figure 1D:
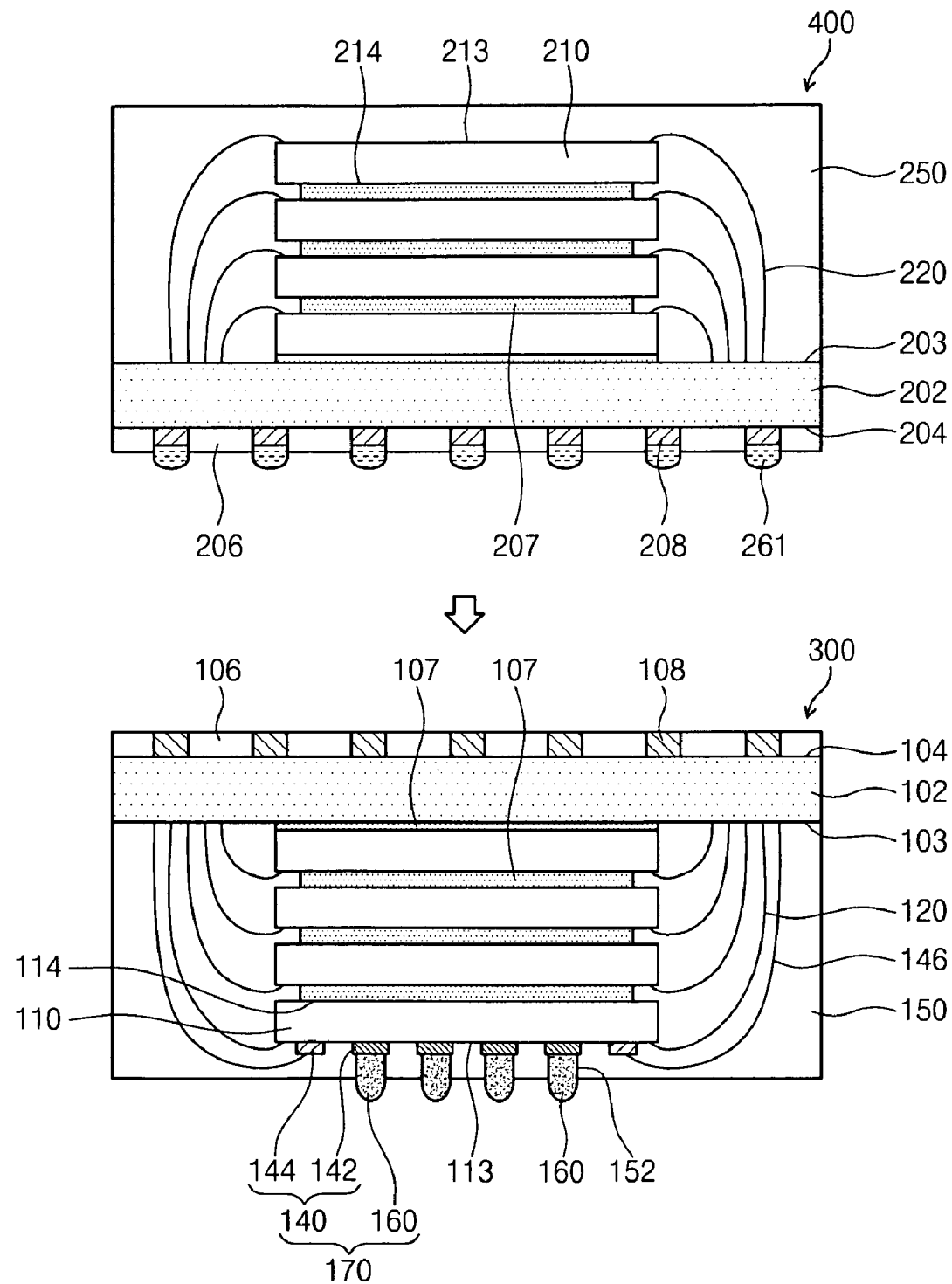

Referring to FIG. 1D, a second semiconductor package 400 to be stacked on the back side 104 of the first semiconductor package 300 is prepared. The second semiconductor package 400 may have a structure similar to that of the first semiconductor package 300. For example, the second semiconductor package 400 may include a plurality of stacked second semiconductor chips 210 protected by a second molding layer 250 on a front side 203 of a second substrate 202. The second semiconductor chips 210 may include an active surface 213 facing away from the second substrate 202 and a nonactive surface 214 facing the second substrate 202. An adhesive 207 may be provided between the second semiconductor chips 210 and the second substrate 202 to secure the second semiconductor chips 210 to the second substrate 202 and may be provided between adjacent second semiconductor chips 210 to secure adjacent second semiconductor chips 210 to one another. The second substrate 202 and the first substrate 102 may be made from materials having a thermal expansion coefficient equal or similar to one another. The plurality of second semiconductor chips 210 may be electrically connected to the second substrate 202 by second bonding wires 220. A second dielectric 206 and second connection pads 208 may be formed on a back side 204 of the second substrate 202 wherein the back side 204 of the second substrate opposes the front side 203 of the second substrate 202. The second connection pads 208 may be exposed by the second dielectric 206. The plurality of second connection pads 208 may be electrically connected to the plurality of second semiconductor chips 210 through a conductive interconnection (not shown) that transmits electrical signals to the inside of the second substrate 202.

A preliminary internal connection terminal 261 may be formed on the back side 204 of the second substrate 202. For example, the preliminary internal connection terminal 261 may include a solder ball or a solder bump. The second semiconductor package 400 may include a ball grid array (BGA) type package. The preliminary internal connection terminal 261 may be formed on the second connection pads 208. The preliminary internal connection terminal 261 may have the same number and arrangement as the first and second connection pads 108 and 208.

The second semiconductor package 400 is stacked on the back side 104 of the first semiconductor package 300 to physically connect the first connection pad 108 with the preliminary internal connection terminal 261.

Figure 1E:
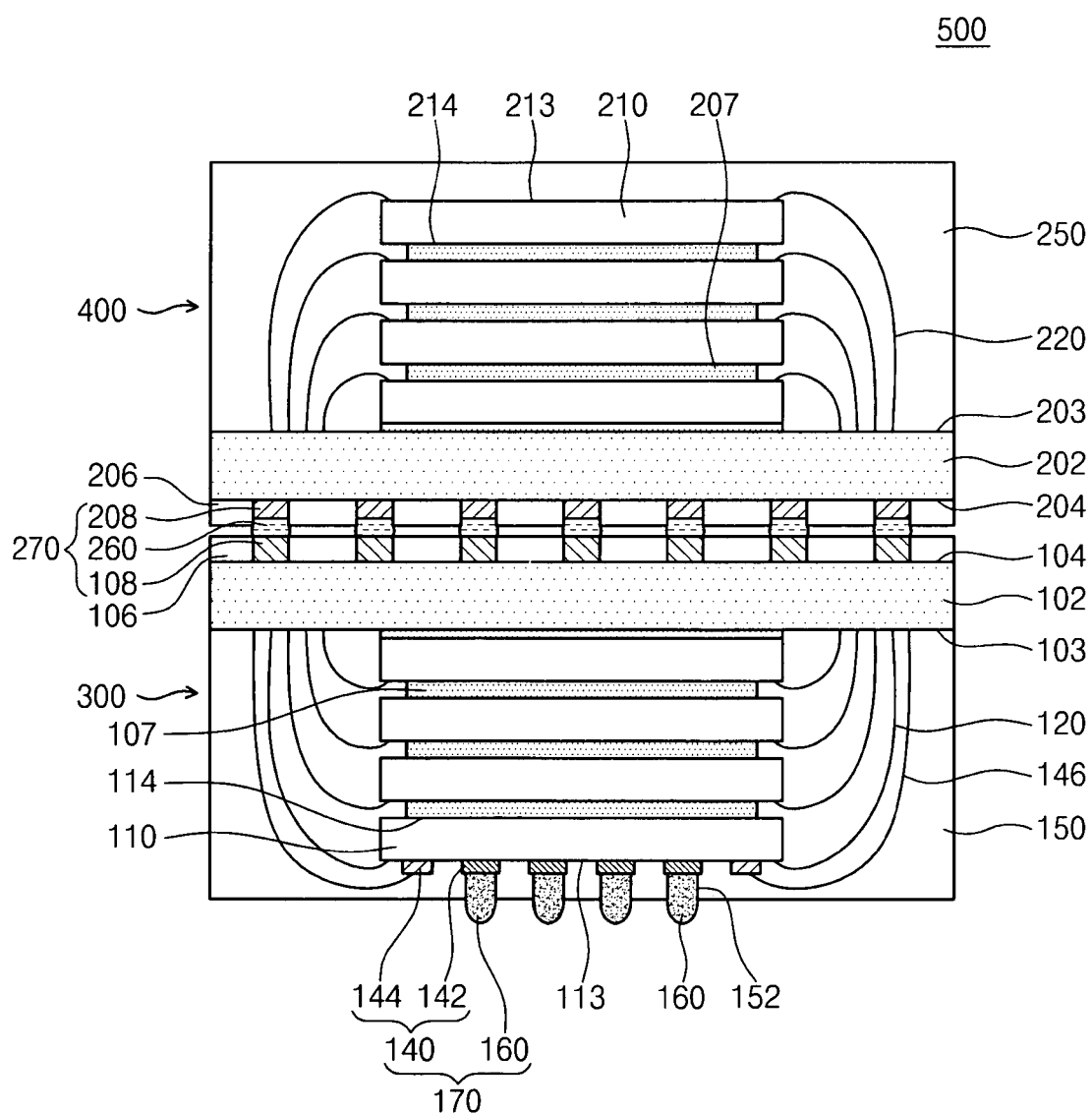

Referring to FIG. 1E, a thermal process, e.g., a reflow process, may be performed on the preliminary internal connection terminal (see reference numeral 261 of FIG. 1D) to form an internal connection terminal 260 between the first and second connection pads 108 and 208. As a result, the internal connection terminal 260 may have a relatively thin thickness and realize a complete electrical coupling with the first and second connection pads 108 and 208. The internal connection terminal 260 may have a pad shape having a relatively thin thickness. The first and second connection pads 108 and 208 and the internal connection terminal 260 may constitute an internal connection member 270. The first and second semiconductor packages 300 and 400 are electrically connected to each other through the internal connection member 270. That is, the plurality of first semiconductor chips 110 is electrically connected to the first connection pads 108, and the plurality of second semiconductor chips 210 is electrically connected to the second connection pads 208. The first and second connection pads 108 and 208 are electrically connected to each other by the internal connection terminal 260. Thus, the first and second semiconductor packages 300 and 400 are electrically connected to each other through the internal connection member 270.

Through the above-described successive processes, the internal connection member 270 is disposed between the back side 104 of the first substrate 102 and the back side 204 of the second substrate 202 to complete a package-on-package (POP) type semiconductor package 500 including the second semiconductor package 400 stacked on the first semiconductor package 300 including the external connection member 170 electrically connected to the outside.

According to the first example embodiment of the inventive concepts, the external connection member 170 electrically connected to the outside is formed on the uppermost first semiconductor chip 110 mounted on the front side 103 of the first substrate 102. Thus, it may prevent the POP type semiconductor package from being warped due to a thermal expansion coefficient difference between the first semiconductor package 300 and the second semiconductor package 400. Furthermore, a size and position of the internal connection terminal 260 for electrically connecting the first semiconductor package 300 to the second semiconductor package 400 may be reduced or minimized. Since the internal connection terminal 260 having the relatively thin thickness is formed between the back side 104 of the first substrate 102 and the back side 204 of the second substrate 202, the first semiconductor package 300 may be closely attached to the second semiconductor package 400. Therefore, a POP type semiconductor package 500 having a low height and improved reliability may be provided.

According to the first example embodiment of the inventive concepts, the first and second semiconductor chips 110 and 210 may be stacked on the first and second substrates 102 and 202 using each of the front surfaces 103 and 203 of the first and second substrates 102 and 202. As a result, the stacking number of the first and second semiconductor chips 110 and 210 may be minimally limited. Thus, the POP type semiconductor package 500 including the first and second semiconductor packages 300 and 400 having high capacity may be provided.

Figure 2A:
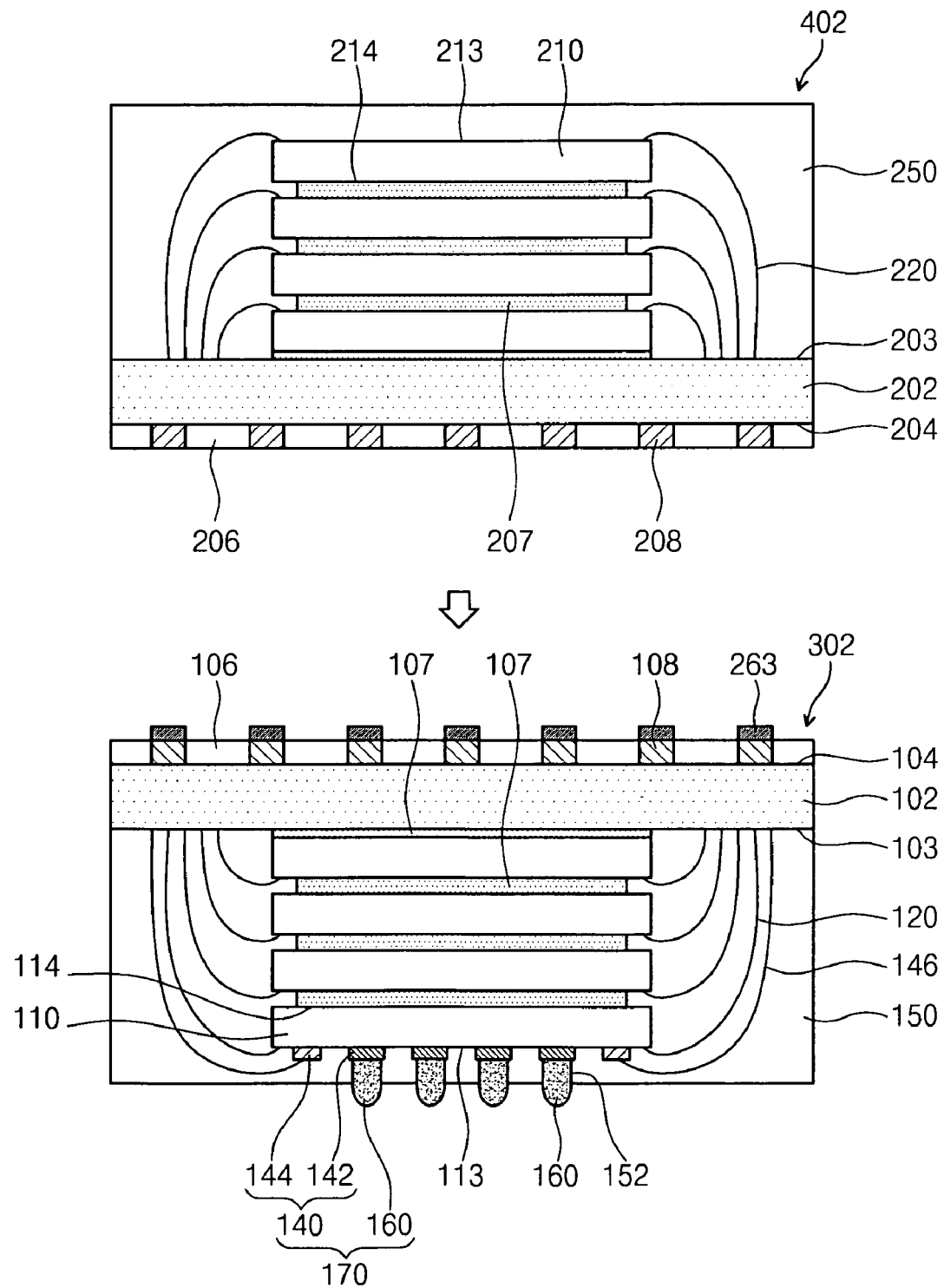
FIGS. 2A and 2B are sectional views illustrating a process of fabricating a semiconductor package according to a second example embodiment of the inventive concepts.
Figure 2B:
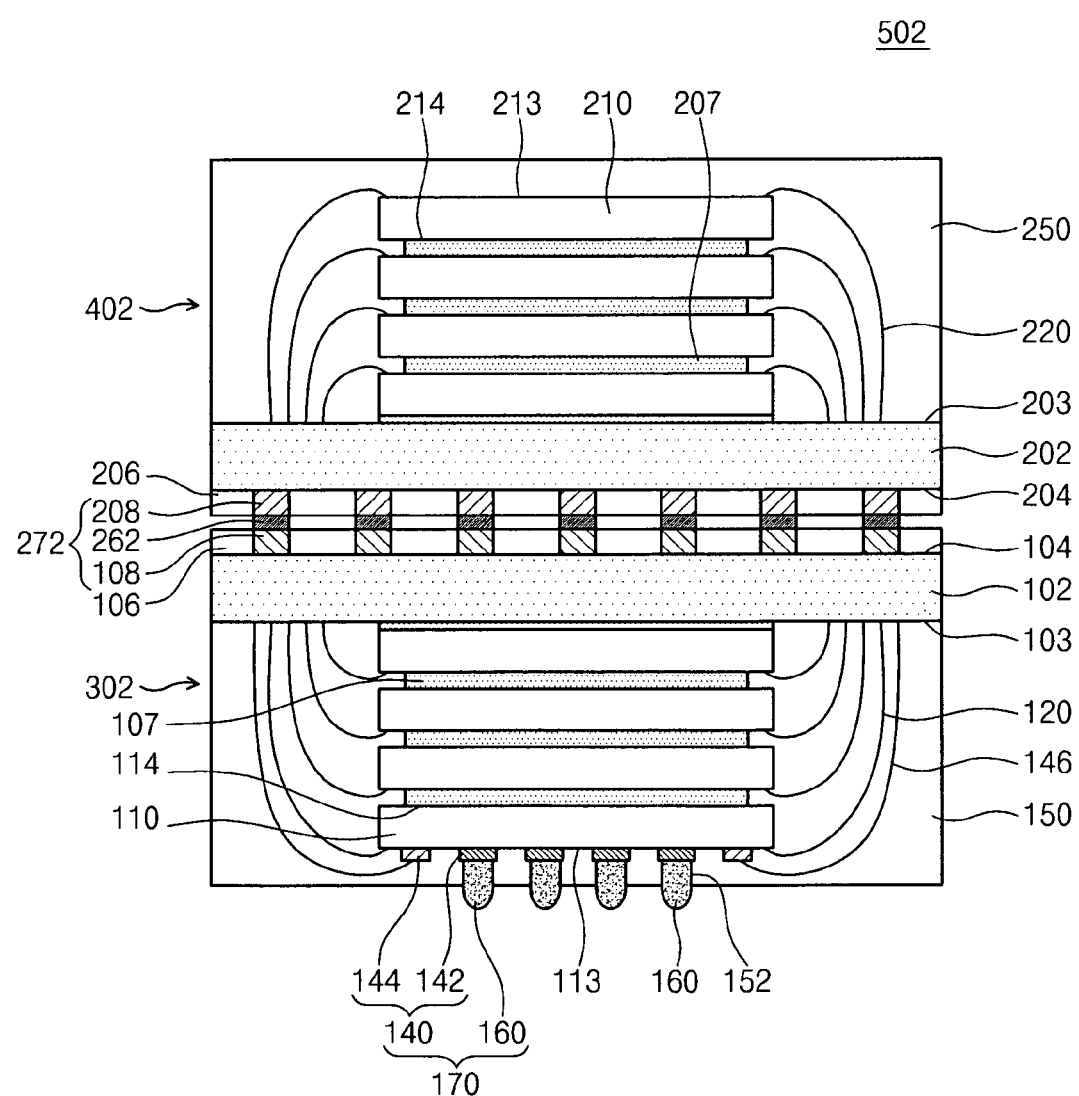

FIGS. 2A and 2B are sectional views illustrating a process of fabricating a semiconductor package according to a second example embodiment of the inventive concepts. Since the second example embodiment is similar to the first example embodiment, only the different points will be described in detail and the same will be briefly described or omitted.

Referring to FIG. 2A, a first semiconductor package 302 and a second semiconductor package 402 are prepared. The first semiconductor package 302 has a structure similar to that 300 of the first example embodiment. Unlike the first example embodiment, a preliminary internal connection terminal 263 may be formed on a first connection pad 108 of a back side 104 of the first substrate 102 of the first semiconductor package 302. For example, the preliminary internal connection terminal 263 covering the first connection pad 108, e.g., a solder paste or a solder pattern may be formed using a printing process.

The second semiconductor package 402 has a structure similar to that 400 of the first embodiment. Unlike the first embodiment, a preliminary internal connection terminal, e.g., a solder ball is not formed on a second connection pad 208 of a back side 204 of a second substrate 202. The second connection pad 208, however, is exposed by a second dielectric 206.

The second semiconductor package 402 is stacked on the back side 104 of the first semiconductor package 302 to physically connect the second connection pad 208 with the preliminary internal connection terminal 263.

Referring to FIG. 2B, a thermal process, e.g., a reflow process, may be performed on the preliminary internal connection terminal 263 to form an internal connection terminal 262 between the first and second connection pads 108 and 208. The first and second connection pads 108 and 208 and the internal connection terminal 262 may constitute an internal connection member 272. Through the above-described successive processes, the internal connection member 272 is disposed between the back side 104 of the first substrate 102 and the back side 204 of the second substrate 202 to complete a POP type semiconductor package 502 including the second semiconductor pdckage 402 stacked on the first semiconductor package 302 including an external connection member 170 electrically connected to the outside.

According to the second example embodiment of the inventive concepts, since the preliminary internal connection terminal 263 covering the first connection pad 108 may be formed using the printing process, the internal connection terminal 262 may be thinner than that 260 of the first example embodiment. Thus, the semiconductor package 502 according to the second example embodiment may have a height less than that 500 of the first example embodiment.

Figure 3A:
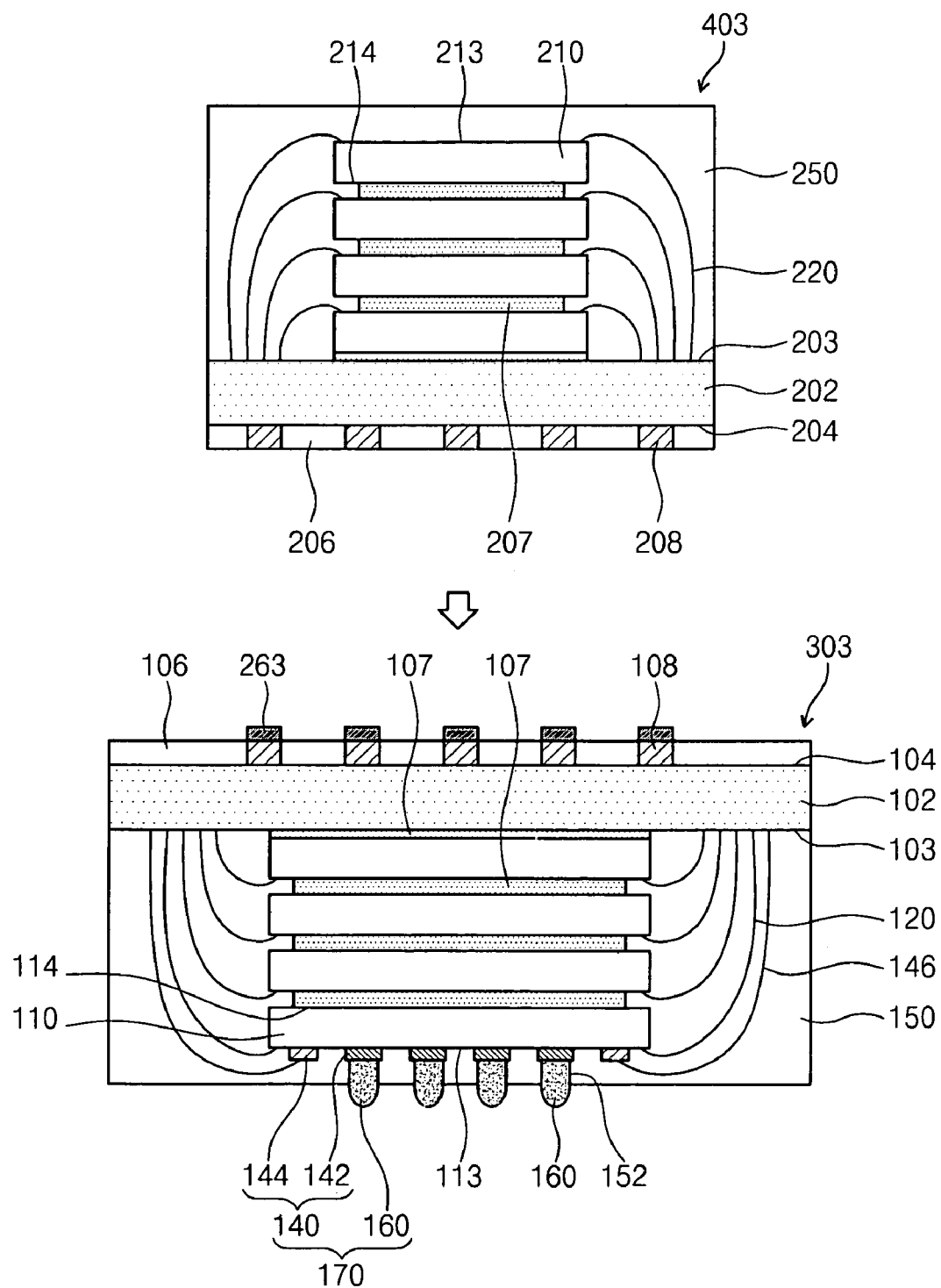
FIGS. 3A and 3B are sectional views illustrating a process of fabricating a semiconductor package according to a third example embodiment of the inventive concepts.
Figure 3B:
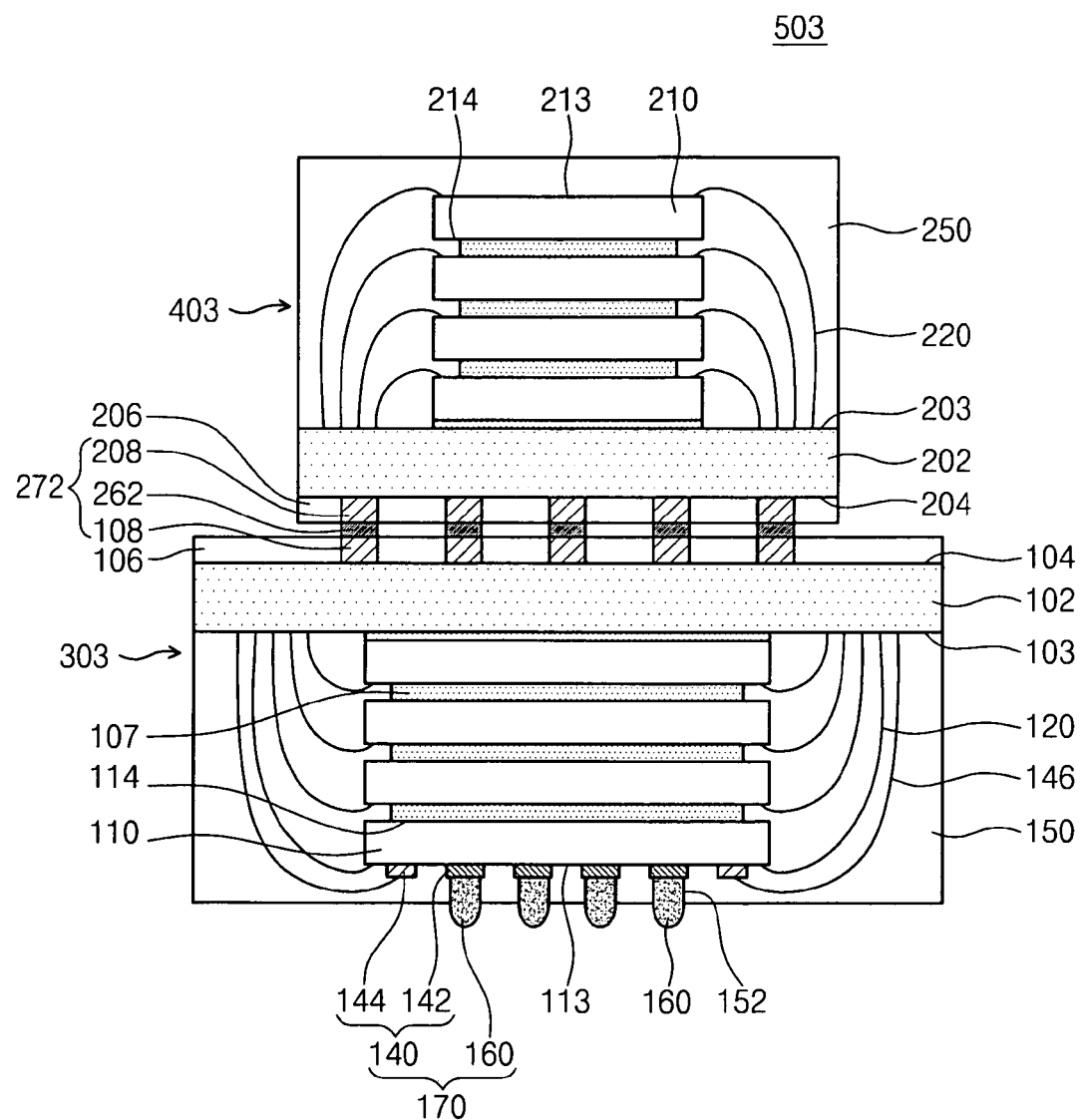

FIGS. 3A and 3B are sectional views illustrating a process of fabricating a semiconductor package according to a third example embodiment of the inventive concepts. Since the third example embodiment is similar to the first example embodiment and/or the second example embodiment, only the different points will be described in detail and the same will be briefly described or omitted.

Referring to FIG. 3A, a first semiconductor package 303 and a second semiconductor package 403 are prepared. The first semiconductor package 303 has a structure similar to that 300 of the first example embodiment. Like the second example embodiment, a preliminary internal connection terminal 263 may be formed on a first connection pad 108 of a back side 104 of the first substrate 102 of the first semiconductor package 303.

The second semiconductor package 402 has a structure similar to that 400 of the first example embodiment. Unlike the second example embodiment, a second connection pad 208 may be exposed by a second dielectric 206. Unlike the first and second example embodiments, the second semiconductor package 403 has a volume less than the first semiconductor package 303. That is, a second substrate 202 has an area less than that of a first substrate 102. The preliminary internal connection terminal 263 may have the same number and arrangement as the first and second connection pads 108 and 208.

The second semiconductor package 403 is stacked on the back side 104 of the first semiconductor package 303 to physically connect the second connection pad 208 with the preliminary internal connection terminal 263.

Referring to FIG. 3B, a thermal process, e.g., a reflow process, may be performed on the preliminary internal connection terminal 263 to form an internal connection terminal 262 between the first and second connection pads 108 and 208. The first and second connection pads 108 and 208 and the internal connection terminal 262 may constitute an internal connection member 272. Through the above-described successive processes, the internal connection member 272 is disposed between the back side 104 of the first substrate 102 and the back side 204 of the second substrate 202 to complete a POP type semiconductor package 503 including the second semiconductor package 403 stacked on the first semiconductor package 303 including an external connection member 170 electrically connected to the outside.

Figure 4A:
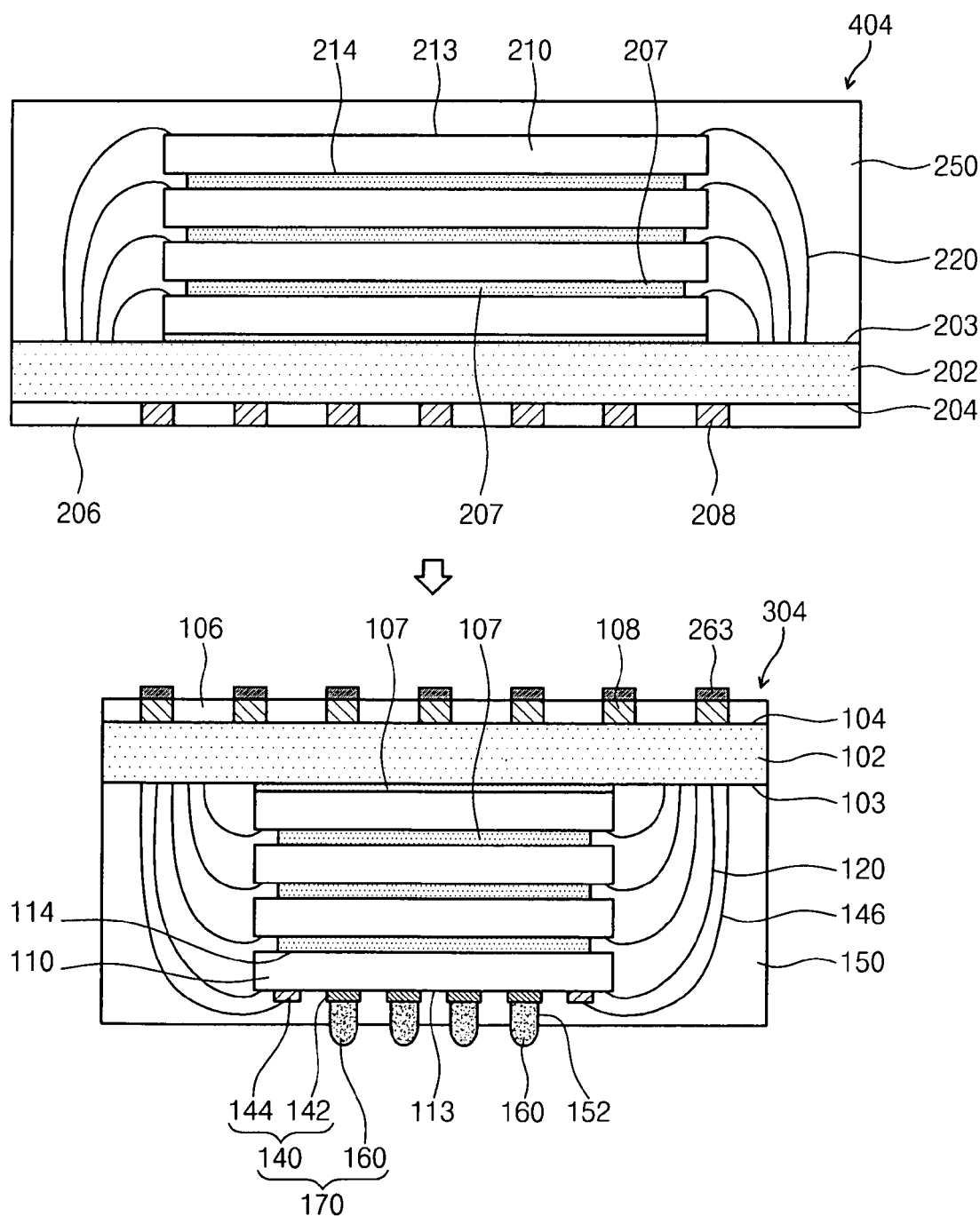
FIGS. 4A and 4B are sectional views illustrating a process of fabricating a semiconductor package according to a fourth example embodiment of the inventive concepts.
Figure 4B:
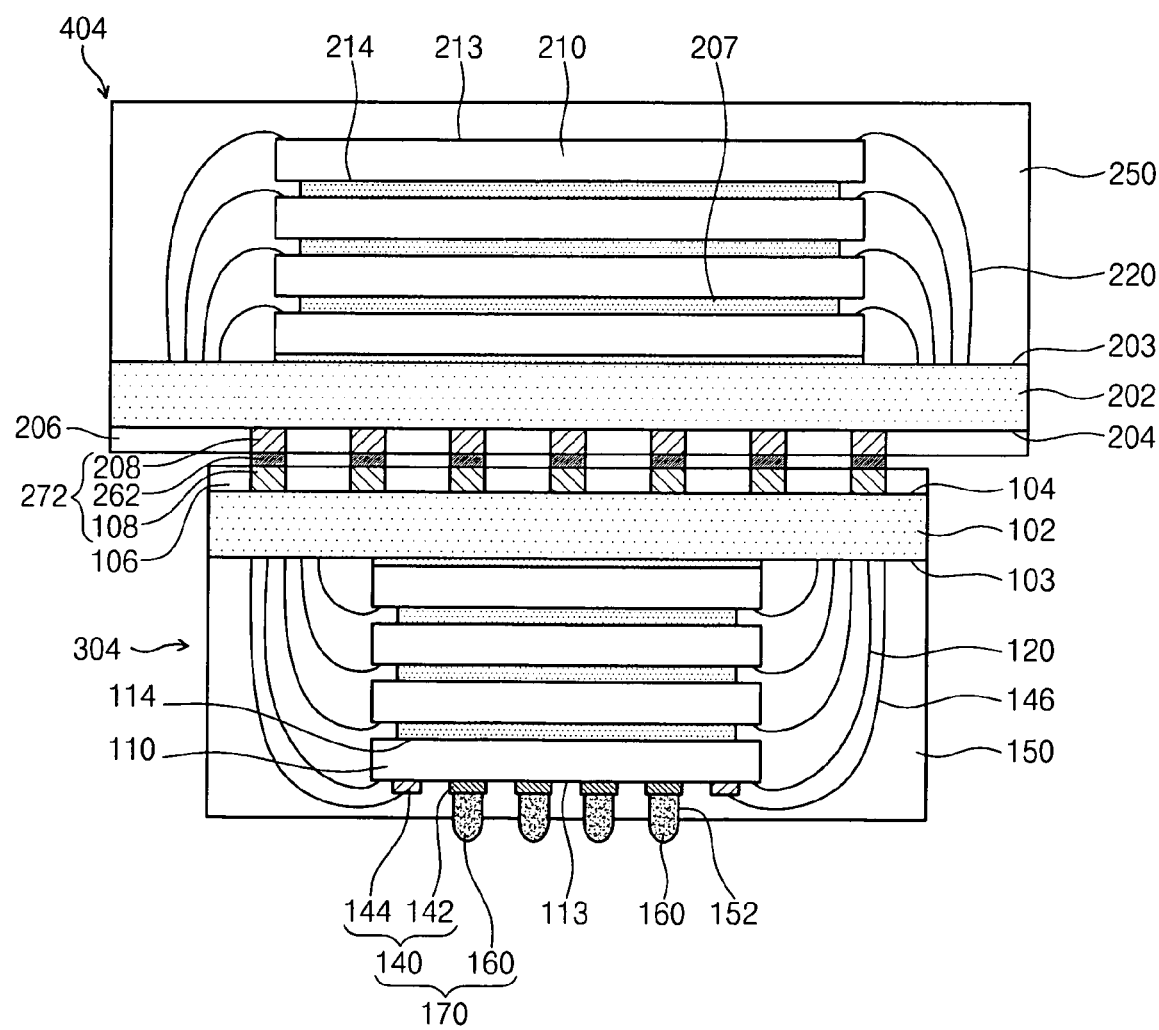

FIGS. 4A and 4B are sectional views illustrating a process of fabricating a semiconductor package according to a fourth example embodiment of the inventive concepts. Since the fourth example embodiment is similar to the third example embodiment and/or the second example embodiment, only the different points will be described in detail and the same will be briefly described or omitted.

Referring to FIG. 4A, a first semiconductor package 304 and a second semiconductor package 404 are prepared. The first semiconductor package 304 has a structure similar to that 303 of the third example embodiment. A preliminary internal connection terminal 263 may be formed on a first connection pad 108 of a back side 104 of a first substrate 102 of the first semiconductor package 304.

The second semiconductor package 404 has a structure similar to that 403 of the third example embodiment. The second semiconductor package 404 may include a second dielectric 206 and a second connection pad 208 exposed by the second dielectric 206 on a back side 204 of a second substrate 202. Unlike the third example embodiment, the second semiconductor package 404 has a volume greater than the first semiconductor package 304. That is, the second substrate 202 has an area greater than that of the first substrate 102. However, the preliminary internal connection terminal 263 may have the same number and arrangement as the first and second connection pads 108 and 208.

The second semiconductor package 404 is stacked on the back side 104 of the first semiconductor package 304 to physically connect the second connection pad 208 with the preliminary internal connection terminal 263.

Referring to FIG. 4B, a thermal process, e.g., a reflow process, may be performed on the preliminary internal connection terminal 263 to form an internal connection terminal 262 between the first and second connection pads 108 and 208. The first and second connection pads 108 and 208 and the internal connection terminal 262 may constitute an internal connection member 272. Through the above-described successive processes, the internal connection member 272 is disposed between the back side 104 of the first substrate 102 and the back side 204 of the second substrate 202 to complete a POP type semiconductor package 504 including the second semiconductor package 404 stacked on the first semiconductor package 304 including an external connection member 170 electrically connected to the outside.

According to the third and fourth example embodiments of the inventive concepts, the first semiconductor packages 303 and 304 and the second semiconductor packages 403 and 404 may have volumes different from each other. That is, the first substrate 102 and the second substrate 202 may have areas different from each other. Since the first substrate 102 and the second substrate 202 may be formed of the same material, a stress applied to the internal connection terminal 262 may be relatively low due to a thermal expansion coefficient difference between the first substrate 102 and the second substrate 202 even through the first substrate 102 has an area greater or less that that of the second substrate 202. Thus, the first semiconductor packages 303 and 304 and the second semiconductor packages 403 and 404 having the volumes different from each other may be provided to provide the POP type semiconductor packages 503 and 504 having improved reliability.

Figure 5A:
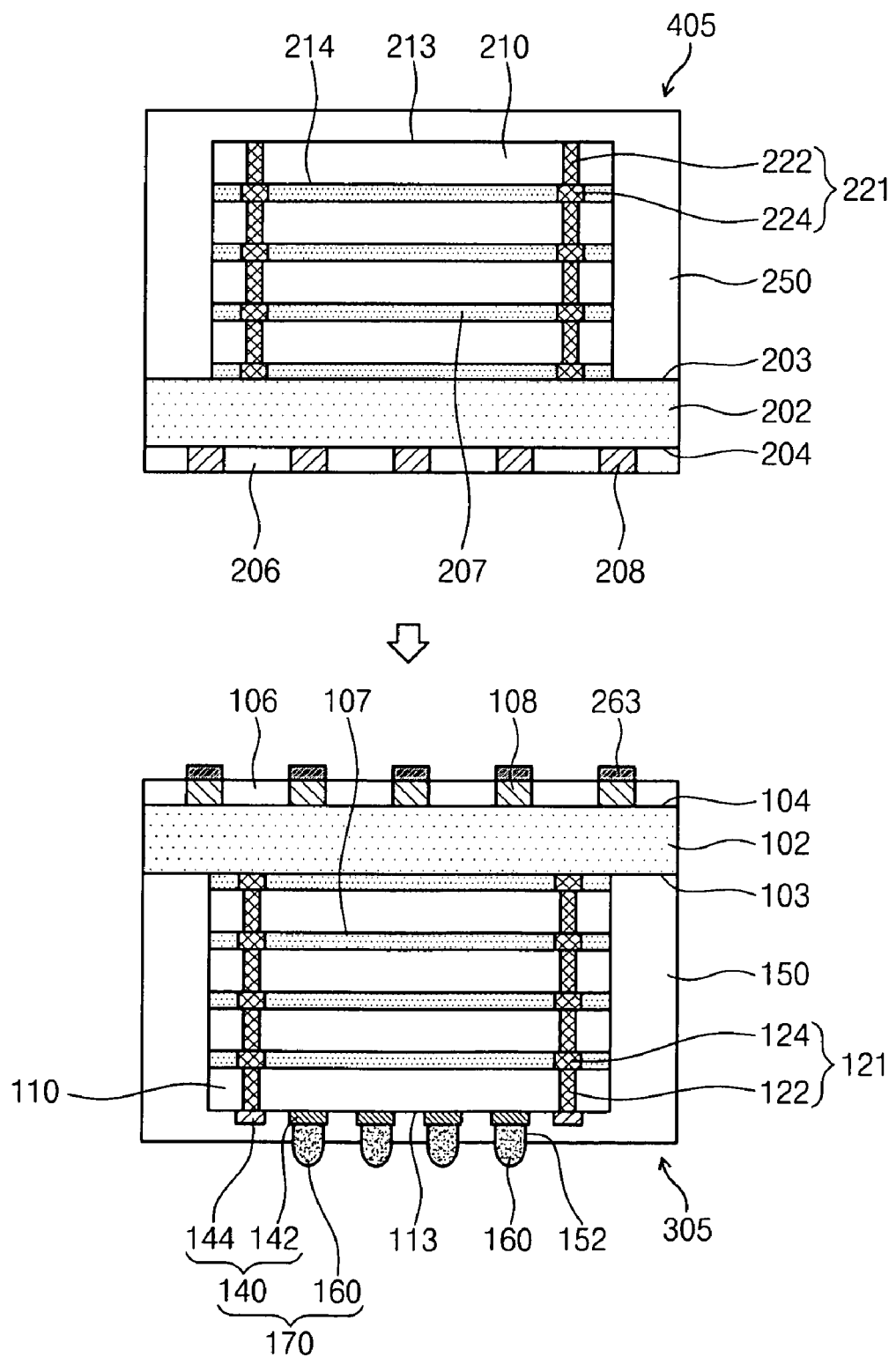
FIGS. 5A and 5B are sectional views illustrating a process of fabricating a semiconductor package according to a fifth example embodiment of the inventive concepts.
Figure 5B:
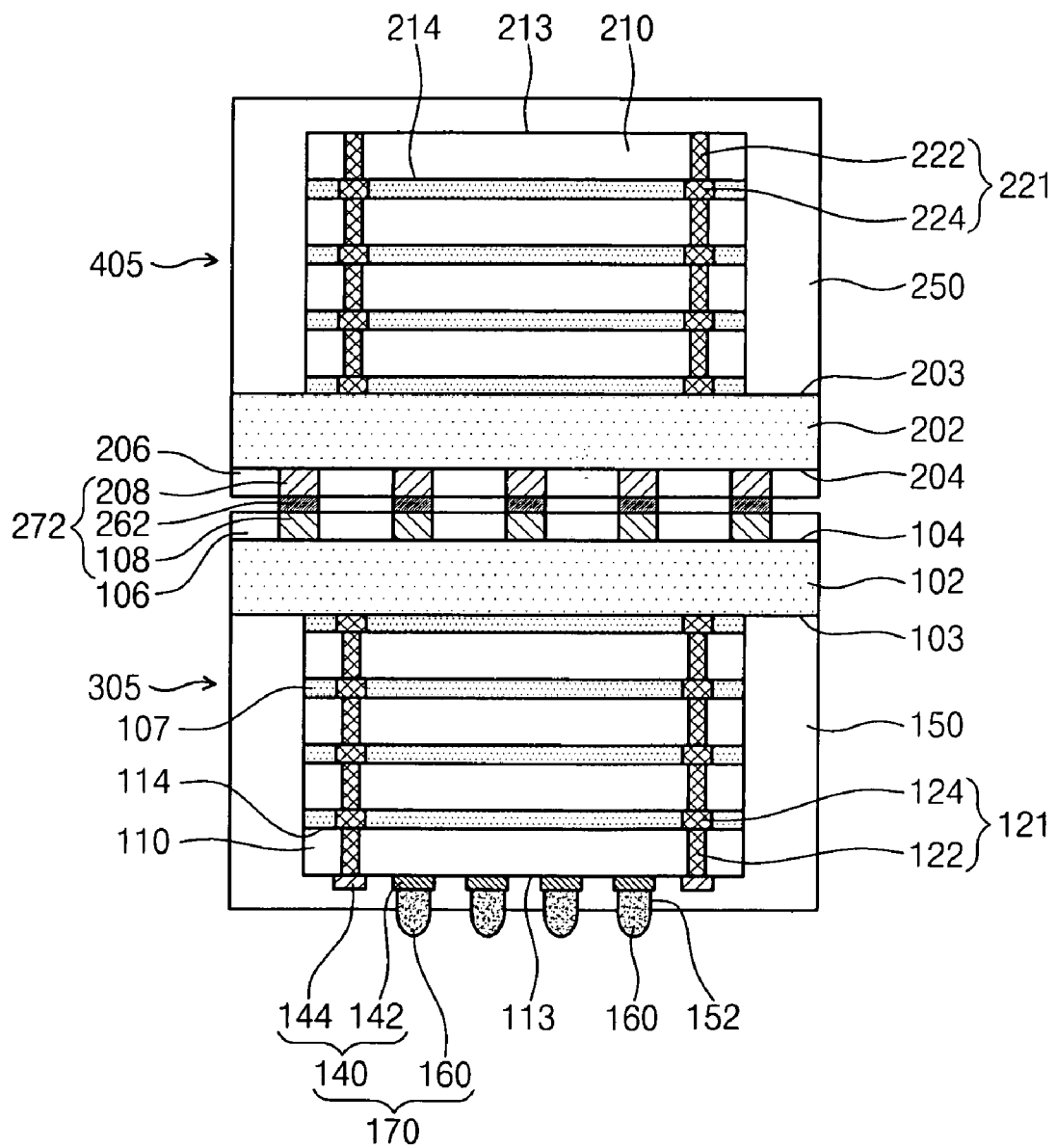

FIGS. 5A and 5B are sectional views illustrating a process of fabricating a semiconductor package according to a fifth example embodiment of the inventive concepts. Since the fifth example embodiment is similar to the first example embodiment and/or the second example embodiment, only the different points will be described in detail and the same will be briefly described or omitted.

Referring to FIG. 5A, a first semiconductor package 305 and a second semiconductor package 405 are prepared. The first semiconductor package 304 has a structure similar to that 300 of the first example embodiment. Unlike the first example embodiment, a plurality of first semiconductor chips 110 may be electrically connected to a first substrate 102 through an electrical connection member, e.g., a plurality of first through electrodes 121. The first through electrodes 121 includes electrodes 122 passing through the first semiconductor chips 110 and electrode pads 124 disposed between the electrodes 122. A first rewiring pad 144 may electrically contact the through electrode 122 of the uppermost semiconductor chip 110. A preliminary internal connection terminal 263 may be formed on a first connection pad 108 of a back side 104 of the first substrate 102 of the first semiconductor package 304.

The second semiconductor package 405 has a structure similar to that 400 of the first example embodiment. A second connection pad 208 may be exposed by a second dielectric 206. Unlike the first example embodiment a plurality of second semiconductor chips 210 may be electrically connected to a second substrate 202 through an electrical connection member, e.g., a plurality of second through electrodes 221. The second through electrodes 221 includes electrodes 222 passing through the second semiconductor chips 210 and electrode pads 224 disposed between the electrodes 222.

The second semiconductor package 405 is stacked on the back side 104 of the first semiconductor package 305 to physically connect the second connection pad 208 with the preliminary internal connection terminal 263.

Referring to FIG. 5B, a thermal process, e.g., a reflow process may be performed on the preliminary internal connection terminal 263 to form an internal connection terminal 262 between the first and second connection pads 108 and 208. The first and second connection pads 108 and 208 and the internal connection terminal 262 may constitute an internal connection member 272. Through the above-described successive processes, the internal connection member 272 is disposed between the back side 104 of the first substrate 102 and the back side 204 of the second substrate 202 to complete a POP type semiconductor package 505 in which the second semiconductor package 405 is stacked on the first semiconductor package 305.

According to the fifth example embodiment, the first and second through electrodes 121 and 221 may be used instead of bonding wires. Thus, corresponding to a space occupied by the bonding wires, the first semiconductor package 305 and the second semiconductor package 405 may have volumes less than those of the first semiconductor packages 300, 302, 303, and 304 and the second semiconductor packages 400, 402, 403, and 404 of the first through fourth embodiments.

Figure 7:
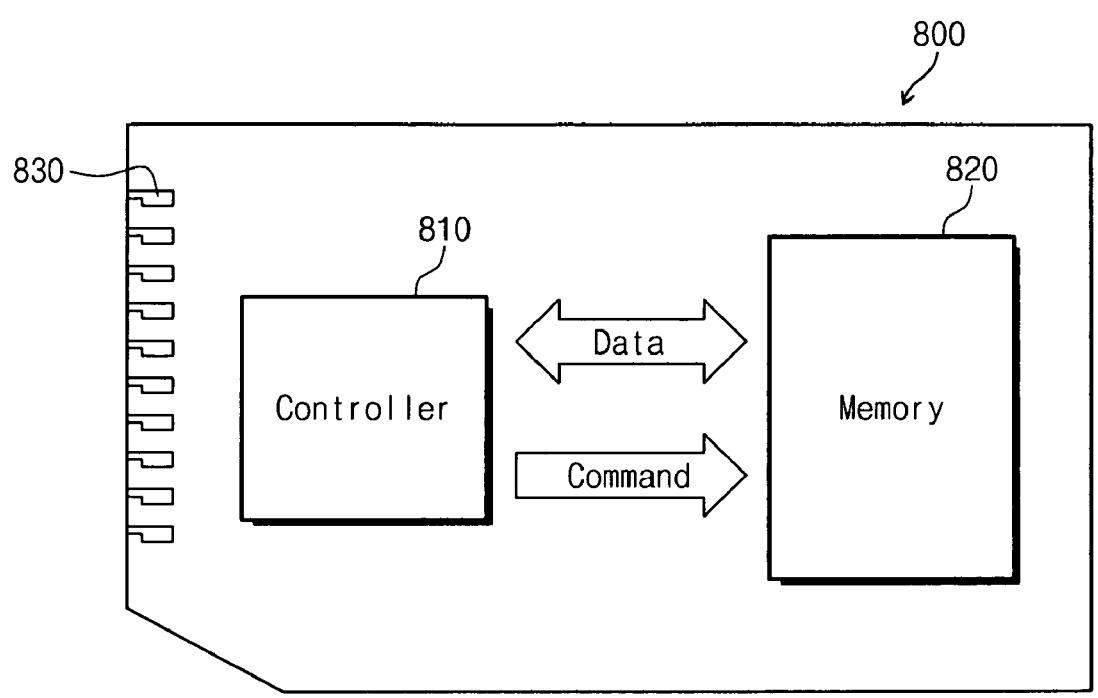
FIG. 7 is a block diagram of a memory card system including a semiconductor package according to an example embodiment of the inventive concepts.

FIG. 7 is a block diagram of a memory card system including a semiconductor package according to an example embodiment of the inventive concepts.

A memory card system 800 including the example semiconductor packages 500, 501, 503, 504, and 505 will now be described with reference to FIG. 7. The memory card system 800 includes a controller 810, a memory 820, and an interface 830. For example, the memory 820 may be used to store commands executed by the controller 810 and/or user data. The controller 810 and the memory 820 may be configured to exchange the commands and the user data. The interface 830 may be used to input/output data with respect to the outside. The semiconductor packages 500, 501, 503, 504, and 505 according to the example embodiments of the inventive concepts may perform functions of the controller 810 and the memory 820 through the POP structure that prevents or reduces warping of the semiconductor packages.

The memory card system 800 may include a multimedia card (MMC), a secure digital card (SDC), or a portable data storage device.

Figure 8:
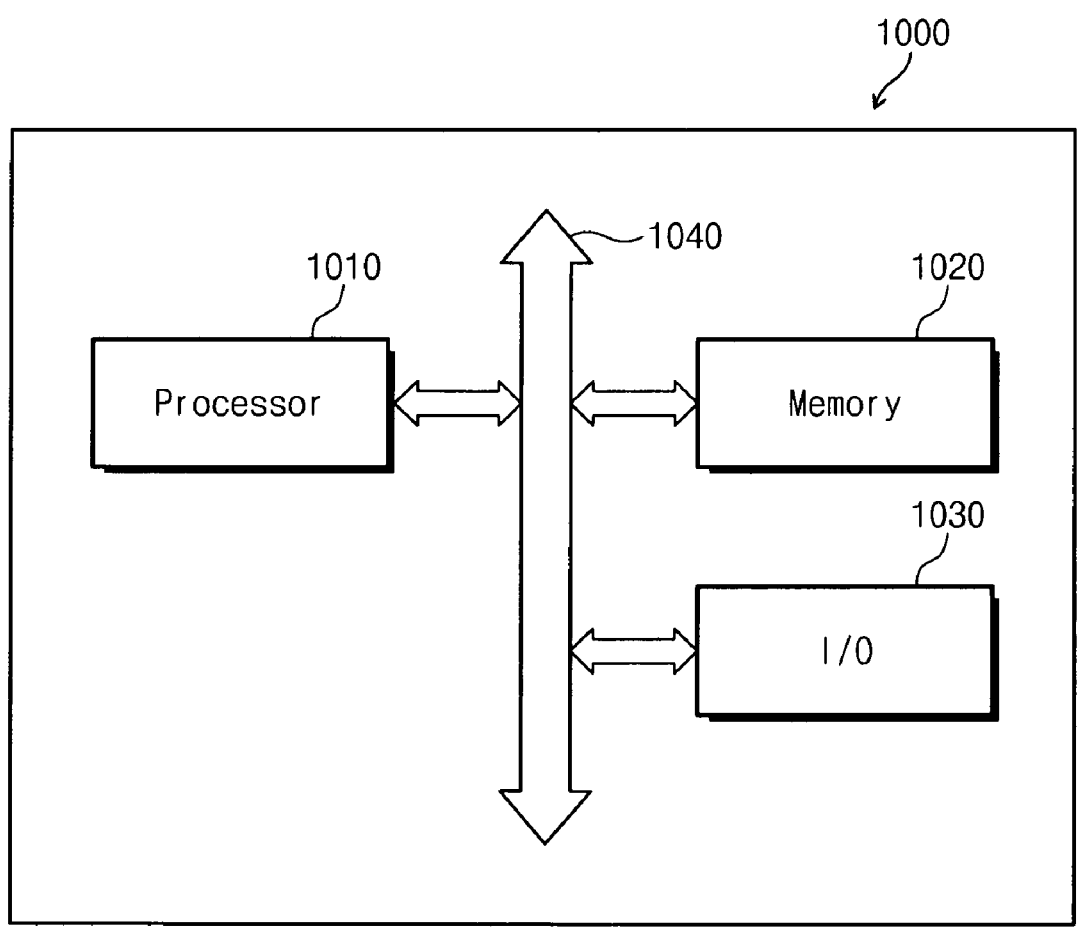
FIG. 8 is a block diagram of an electronic device including a semiconductor package according to an example embodiment of the inventive concepts.

FIG. 8 is a block diagram of an electronic device including a semiconductor package according to an example embodiment of the inventive concepts.

An electronic device 1000 including the example semiconductor packages 500, 501, 503, 504, and 505 will now be described with reference to FIG. 8. The electronic device 1000 includes a processor 1010, a memory 1020, and an input/output (I/O) device 1030. The processor 1010, the memory 1020, and the I/O device 1030 may be connected through a bus 1040. The memory 1020 may receive control signals such as RAS*, WE*, and CAS* from the processor 1010. The memory 1020 may be used to store data accessed through the bus 1040. Those skilled in the art will readily understand that additional circuits and control signals may be provided for specific example embodiments and modifications of the inventive concepts.

The electronic device 1000 may be used in computer systems, wireless communication devices, PDAs, laptop computers, portable computers, Web tablets, wireless phones, portable phones, digital music players, MP3 players, navigation devices, solid-state disks (SSDs), household appliances, or other wireless data communication devices.

According to the example embodiments of the inventive concepts, warping of a POP type semiconductor package may be prevented or reduced due to the thermal expansion coefficient difference between a first semiconductor package and a second semiconductor package stacked on the first semiconductor package. Furthermore, the size and position of the internal connection terminal for electrically connecting the first semiconductor package to the second semiconductor package may be minimized or reduced. Therefore, the POP type semiconductor package having the low height and the improved reliability may be provided.

According to the example embodiments of the inventive concepts, the POP type semiconductor package including the first and second semiconductor packages having the high capacity may be provided.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A semiconductor package comprising:
a first package including a first substrate having a first front side and a first back side opposing the first front side, the first package further including a first semiconductor chip on the first front side and an external connection member on the first semiconductor chip, the external connection member being configured to electrically connect the first semiconductor chip to an external device;
a second package including a second substrate having a second front side and a second back side, the second back side facing the first back side of the first substrate, the second front side opposing the second back side, the second package further including a second semiconductor chip on the second front side; and
an internal connection member between the first back side and the second back side electrically connecting the first package to the second package,
wherein the external connection member includes a first rewiring pad electrically connected to the first substrate and a second rewiring pad electrically connected to the first rewiring pad,
wherein the first package further includes a first molding layer on the first semiconductor chip, the first molding layer covering the first rewiring pad and having a hole exposing the second rewiring pad, and the second package further includes a second molding layer on the second semiconductor chip, and
wherein the external connection member further includes an external connection terminal in the hole, the external connection member having a first portion in the hole contacting the second rewiring pad and a second portion outside the hole.

2. The semiconductor package of claim 1, wherein the first substrate and the second substrate have substantially equal coefficients of thermal expansion.

3. The semiconductor package of claim 1, wherein the first substrate has an area that is one of less than that of the second substrate and greater than that of the second substrate.

4. The semiconductor package of claim 1, wherein the internal connection member comprises:
a first connection pad on the first back side of the first substrate, the first connection pad being electrically connected to the first semiconductor chip;
a second connection pad on the second back side of the second substrate, the second connection pad being electrically connected to the second semiconductor chip; and
an internal connection terminal between the first connection pad and the second connection pad to electrically connect the first connection pad to the second connection pad.

5. The semiconductor package of claim 4, wherein the internal connection terminal has a pad shape.

6. The semiconductor package of claim 1, wherein
the first package further includes a first conductive member electrically connecting the first rewiring pad to the first substrate, and
the second package further comprises a second conductive member electrically connecting the second semiconductor chip to the first substrate.

7. The semiconductor package of claim 6, wherein the first and second conductive members comprise one of a bonding wire and a through electrode.

8. The semiconductor package of claim 1, further comprising:
a plurality of semiconductor chips between the first semiconductor chip and the first substrate.

9. The semiconductor package of claim 1, further comprising:
a dielectric layer on the second back side of the second package; and
connection pads on the second back side of the second package, wherein the dielectric layer is configured to expose the connection pads.

10. The semiconductor package of claim 9, wherein a thickness of the dielectric layer is thicker than a thickness of the connection pads.

11. The semiconductor package of claim 10, wherein
the internal connection member is on the connection pads and the internal connection member is partly covered by the dielectric layer.

12. The semiconductor package of claim 1, further comprising:
a plurality of first connection pads on the first back side of the first package; and
a plurality of second connection pads on the second back side of the second package, wherein the plurality of first connection pads are arranged to face the plurality of second connection pads.

13. The semiconductor package of claim 12, further comprising:
a plurality of internal connection terminals between the plurality of first connection pads and the plurality of second connection pads.

14. The semiconductor package of claim 13, wherein a thickness of the plurality of second connection pads is smaller than a thickness of the plurality of first connection pads.

15. A memory card system comprising:
an interface;
a memory; and
a controller configured to communicate externally via the interface and to control the memory, and at least one of the memory and the controller is embodied as a semiconductor package, the semiconductor package including,
a first package including a first substrate having a first front side and a first back side opposing the first front side, the first package further including a first semiconductor chip on the first front side and an external connection member on the first semiconductor chip, the external connection member being configured to electrically connect the first semiconductor chip to an external device,
a second package including a second substrate having a second front side and a second back side, the second back side facing the first back side of the first substrate, the second front side opposing the second back side, the second package further including a second semiconductor chip on the second front side, and
an internal connection member between the first back side and the second back side electrically connecting the first package to the second package,
wherein the external connection member includes a first rewiring pad electrically connected to the first substrate and a second rewiring pad electrically connected to the first rewiring pad,
wherein the first package further includes a first molding layer on the first semiconductor chip, the first molding layer covering the first rewiring pad and having a hole exposing the second rewiring pad, and the second package further includes a second molding layer on the second semiconductor chip, and
wherein the external connection member further includes an external connection terminal in the hole, the external connection member having a first portion in the hole contacting the second rewiring pad and a second portion outside the hole.

16. An electronic device comprising:
a processor;
a memory;
an input/output device; and
a bus connecting to the processor, the memory, and the input/output device, wherein in the memory includes a semiconductor package and the semiconductor package includes,
a first package including a first substrate having a first front side and a first back side opposing the first front side, the first package further including a first semiconductor chip on the first front side and an external connection member on the first semiconductor chip, the external connection member being configured to electrically connect the first semiconductor chip to an external device,
a second package including a second substrate having a second front side and a second back side, the second back side facing the first back side of the first substrate, the second front side opposing the second back side, the second package further including a second semiconductor chip on the second front side, and
an internal connection member between the first back side and the second back side electrically connecting the first package to the second package,
wherein the external connection member includes a first rewiring pad electrically connected to the first substrate and a second rewiring pad electrically connected to the first rewiring pad,
wherein the first package further includes a first molding layer on the first semiconductor chip, the first molding layer covering the first rewiring pad and having a hole exposing the second rewiring pad, and the second package further includes a second molding layer on the second semiconductor chip, and
wherein the external connection member further includes an external connection terminal in the hole, the external connection member having a first portion in the hole contacting the second rewiring pad and a second portion outside the hole.

* * * * *